US008892388B2

(12) United States Patent
Courtade et al.

(10) Patent No.: US 8,892,388 B2
(45) Date of Patent: Nov. 18, 2014

(54) BOX COUNTING ENHANCED MODELING

(75) Inventors: Sergio Fabio Courtade, Heggedal (NO); Alina-Berenice Christ, Bad Honnef (DE); Horacio Ricardo Bouzas, Oslo (NO)

(73) Assignee: Schlumberger Technology Corporation, Sugar Land, TX (US)

( * ) Notice: Subject to any disclaimer, the term of this patent is extended or adjusted under 35 U.S.C. 154(b) by 477 days.

(21) Appl. No.: 13/241,013

(22) Filed: Sep. 22, 2011

(65) Prior Publication Data

US 2012/0084043 A1 Apr. 5, 2012

Related U.S. Application Data

(60) Provisional application No. 61/388,107, filed on Sep. 30, 2010.

(51) Int. Cl.
*G06F 19/00* (2011.01)
*G06G 7/48* (2006.01)
*G06F 17/50* (2006.01)

(52) U.S. Cl.
CPC ................... *G06F 17/5009* (2013.01)
USPC .............................. 702/123; 367/73; 702/155

(58) Field of Classification Search
CPC ....... G01V 1/282; G01V 3/38; G06F 17/5009

USPC .................. 702/2, 6, 7, 11, 14, 85, 123, 155; 367/73

See application file for complete search history.

(56) References Cited

U.S. PATENT DOCUMENTS 5,661,698 A * 8/1997 Cacas ............................. 367/73

* cited by examiner

*Primary Examiner* — John H Le
(74) *Attorney, Agent, or Firm* — Lam Nguyen; Rodney Warfford; Garrett Atkinson

(57) ABSTRACT

A method can include providing spatial data for a base case of a subsurface geologic formation; providing spatial data for a simulation case of the subsurface geologic formation; performing box counting for the spatial data for the base case; performing box counting for the spatial data for the simulation case; based on the box counting for the spatial data for the base case, determining a fractal dimension for the base case; based on the box counting for the spatial data for the simulation case, determining a fractal dimension for the simulation case; comparing the simulation case to the base case based at least in part on the fractal dimensions; and, based on the comparing, adjusting one or more simulation parameters to generate spatial data for an additional simulation case of the subsurface geologic formation. Various other apparatuses, systems, methods, etc., are also disclosed.

12 Claims, 11 Drawing Sheets

BOX COUNTING ENHANCED MODELING

CROSS-REFERENCE TO RELATED APPLICATION

This application claims the benefit of U.S. Provisional Patent Application 61/388,107 filed Sep. 30, 2010 entitled "A Process for Characterization of Geometry on 2D and 3D Datasets Using Boxcounting," the entirety of which is incorporated by reference herein.

BACKGROUND

Various industries rely on computer-based modeling applications to perform tasks related to research, development, economics, etc. Such applications often include features for data interpretation, model generation, model refinement and model-based simulation. For reservoir modeling in the oil and gas industries, a seismic to simulation application may provide interactive tools that allow a user to load and interpret seismic data, for example, to identify geologic features such as facies, geobodies, etc. Such interactive tools often render information to a display to allow a user to visually inspect and interpret the data. Depending on experience and level of expertise, visual inspection and interpretation can be time consuming. For example, where an application performs ant tracking as a tool to visually enhance features in seismic data, a user may iteratively adjust one or more ant tracking parameters in an effort to optimize the enhancement algorithm and ultimately facilitate interpretation. In turn, interpretation can be used for model generation, model refinement and model-based simulation. Accordingly, a faulty or suboptimal interpretation can confound subsequent workflow efforts. According to an embodiment, various technologies and techniques provide for analysis of data, which may be actual data, processed data, simulation data, etc. Such technologies and techniques may increase accuracy of visual-based data interpretation and expedite workflows.

SUMMARY

A method can include performing box counting on an optimal or base data set and performing box counting on a test data set where the box counting provides parameter values that allow for an objective comparison of the test data set to the base data set. In turn, additional test data sets may be provided until parameter values for a test data set and the base data set are within a pretermined threshold. Such a method may optionally be applied to processes that rely on subjective judgment, for example, as judged via visual comparison of data sets. Various other apparatuses, systems, methods, etc., are also disclosed.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Features and advantages of the described implementations can be more readily understood by reference to the following description taken in conjunction with the accompanying drawings.

DETAILED DESCRIPTION

Figure 1:
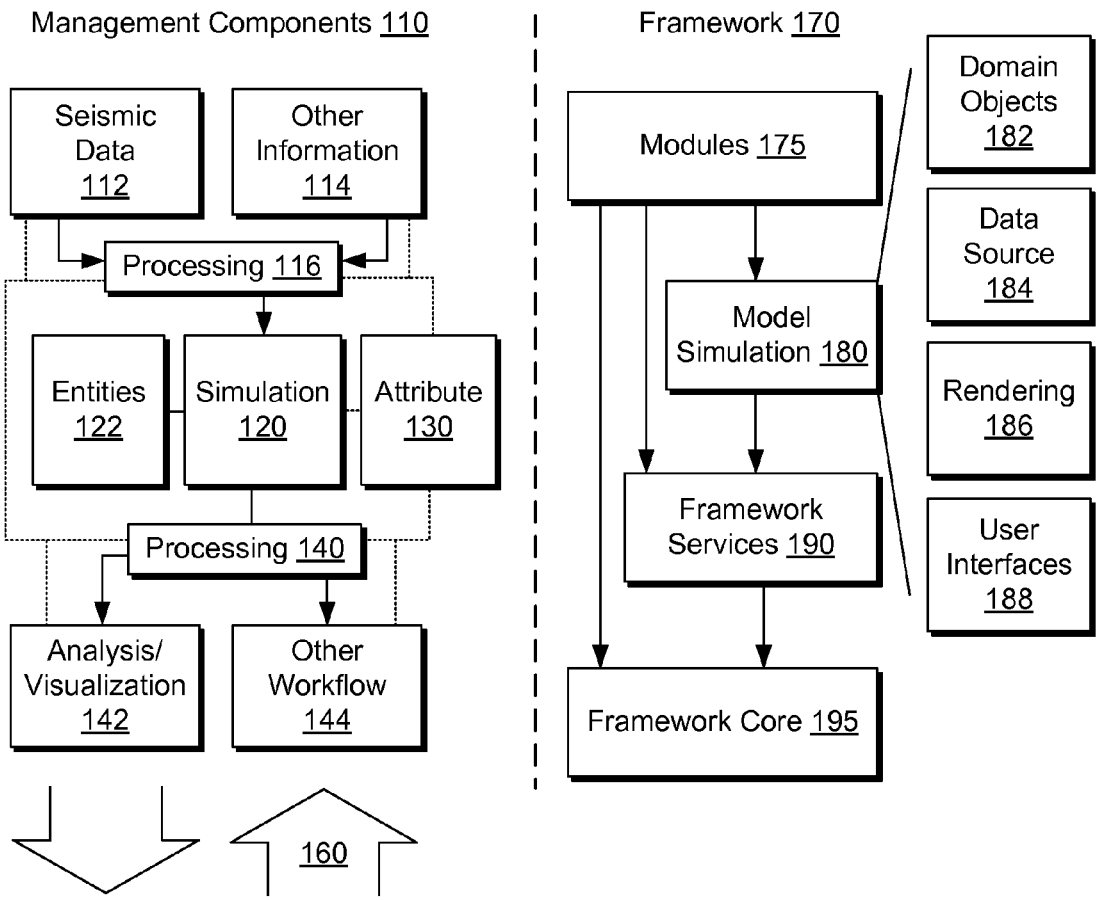
FIG. 1 illustrates an example system that includes various components for simulating and optionally interacting with a geological environment.
Figure 1:
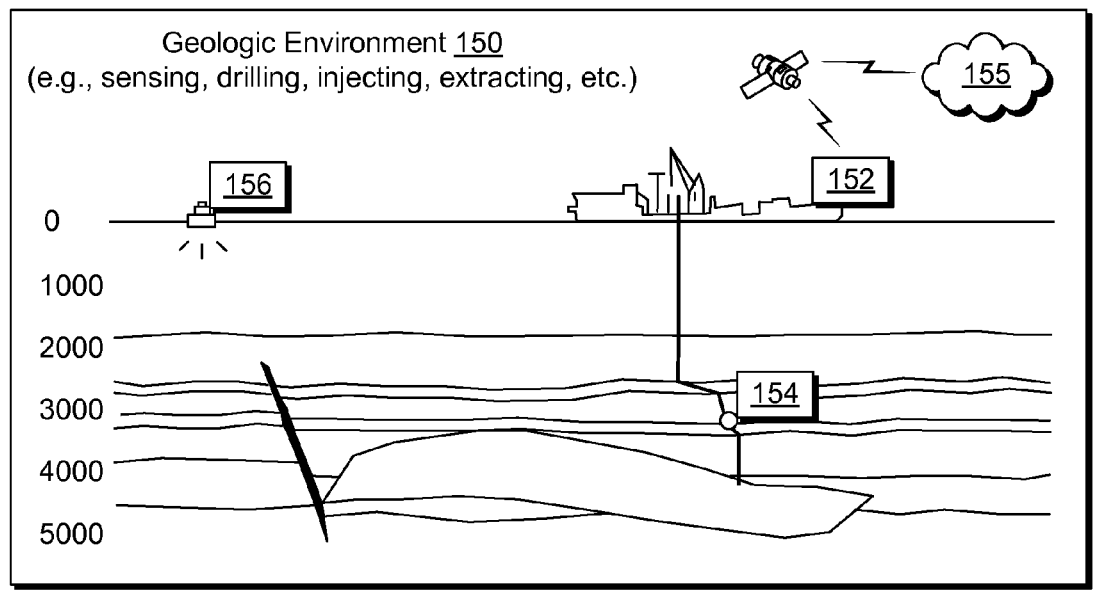

The following description includes the best mode presently contemplated for practicing the described implementations. This description is not to be taken in a limiting sense, but rather is made merely for the purpose of describing the general principles of the implementations. The scope of the described implementations should be ascertained with reference to the issued claims.

As described in various examples herein, box counting can characterize a spatial distribution of a property in a dataset. Such characterization can provide one or more parameters values that allow for expeditious comparison and decision making. One parameter described herein is referred to as a "fractal dimension", or more formally, the Minkowski-Bouligand dimension, Minkowski dimension or box counting dimension (e.g., estimate of a fractal dimension of a set in a Euclidean space). Another parameter described herein is a regression coefficient or fit coefficient, which may be based on fitting box counting values to a model such as a line. Further, according to an embodiment, a parameter may be directional, for example, to characterize isotropy or anisotropy.

In general, one or more parameters stemming from a box counting analysis can be used to classify multidimensional data (e.g., 2D images, 3D volumes, etc.) according to a spatial distribution of one or more properties, where box counting may be performed in a single dimension or in multiple dimensions. Values for the one or more parameters can be used as quality indicators, classification metrics, identification metrics, workflow triggers, etc. For example, regarding workflow triggers, a subsequent workflow process may depend on a parameter value meeting a trigger criterion, which may be a data quality criterion, a data enhancement quality criterion, etc.

In the realm of subsurface geological analysis, one or more parameters associated with a box counting process may be quality indicators for seismic processing and facies simulation. For example, parameters values obtained from a box counting process may indicate similarity between an optimum or base case and different simulations cases in an iterative optimization process. As the number of simulation cases may be quite large (e.g., greater than about 10 and possibly greater than about 100), visual inspection may be impractical. Accordingly, such a process may output information as to a top 5 simulation cases (e.g., or other suitable number) and allow for rendering information to a display for visual inspection and optionally selection of a best simulation case. According to an embodiment, a best simulation case may be used as a seed for further simulation cases (e.g., using a simulation parameter value generation process that relies on one or more parameter values of the best case).

According to an embodiment, a box counting analysis can characterize a geometrical distribution of one or more properties in data, whether actual data, processed data, simulation data, etc., using one or more parameters. In turn, values for parameters can be used as, or to generate, signatures of the data. For example, a parameter value by itself may be a signature of a property in a data set, or two parameter values may be combined using an equation (e.g., optionally a weighted equation) to provide a signature of a property in a data set. Yet further, where multiple properties are of interest, a signature for a data set may depend on parameter values for each of the properties (e.g., via an equation that depends on a box counting parameter value for a first property of a data set, a box counting parameter value for a second property of a data set, etc.). Where a subsurface volume has multiple associated data sets, property analysis for each data set may be performed where a signature optionally depends on values from each property analysis.

According to an embodiment, a box counting process can characterize data and output one or more parameters that are quality indicators for an image or a volume, classifiers for an image or a volume, identifiers for an image or a volume, etc. With respect to geometries, data may include features representative of complex geometries.

According to an embodiment, a box counting process can output one or more quality indicators to optimize one or more other processes. For example, a box counting process may output image parameter values as quality indicators to control a process that enhances images for seismic structural interpretation or a process that performs a facies population analysis.

Structural interpretation of reflection seismic data is an activity that may be carried out in a number of industries (e.g., oil and gas exploration and development, mining, water development, waste management, $CO_2$ sequestration, etc.). Structural interpretation may be carried out on seismic sections and may involve interpretation of faults and/or of seismic horizons. An approach to facilitate and accelerate structural interpretation may include running structural enhancement processes over the seismic data as to highlight the faults (e.g., consider ant tracking, variance cube, etc.). These structural enhancement processes may involve optimization of a number of variables, which may be commonly carried out through an iterative process that is validated by visual analysis of the resulting seismic volume.

According to an embodiment, a box counting process can be implemented where resulting cross plot and fractal dimension values serve as parameters that characterize the visual quality of the seismic information. In turn, seismic enhancement process variables can be iterated so as to optimize, for example, a fractal dimension parameter value or one or more other parameter values.

As to facies population analysis, for a field of 3D modeling properties (e.g., for geologic modeling and reservoir simulation), many different algorithms exist. Such different algorithms may have a number of control variables and a final result may be validated by visual verification.

According to an embodiment, a box counting process may be performed on a resulting 2D or 3D property model where output from box counting is cross plotted and a fractal dimension value determined as at least one parameter to characterize the spatial distribution of one or more properties of the property model. In turn, property population process variables can be iterated as to optimize, for example, a fractal dimension parameter value or one or more other parameter values or any particular combination of parameter values.

To facilitate explanation of various examples of box counting and related processes, FIG. 1 shows an example of a system 100 that includes various management components 110 to manage various aspects of a geologic environment 150. For example, the management components 110 may allow for direct or indirect management of sensing, drilling, injecting, extracting, etc., with respect to the geologic environment 150. In turn, further information about the geologic environment 150 may become available as feedback 160 (e.g., optionally as input to one or more of the management components 110).

In the example of FIG. 1, the geologic environment 150 may be outfitted with any of a variety of sensors, detectors, actuators, etc. For example, equipment 152 may include communication circuitry to receive and to transmit information with respect to one or more networks 155. Such information may include information associated with downhole equipment 154, which may include equipment to acquire information, to assist with resource recovery, etc. Other equipment 156 may be located remote from a well site and include sensing, detecting, emitting or other circuitry. Such equipment may include storage and communication circuitry to store and to communicate data, instructions, etc.

As to the management components 110 of FIG. 1, these may include a seismic data component 112, an information component 114, a pre-simulation processing component 116, a simulation component 120, an attribute component 130, a post-simulation processing component 140, an analysis/visualization component 142 and a workflow component 144. In operation, seismic data and other information provided per the components 112 and 114 may be input to the simulation component 120, optionally with pre-simulation processing via the processing component 116 and optionally with post-simulation processing via the processing component 140.

According to an embodiment, the simulation component 120 may rely on entities 122. Entities 122 may include earth entities or geological objects such as wells, surfaces, reservoirs, etc. In the system 100, the entities 122 may include virtual representations of actual physical entities that are reconstructed for purposes of simulation. The entities 122 may be based on data acquired via sensing, observation, etc. (e.g., the seismic data 112 and other information 114).

According to an embodiment, the simulation component 120 may rely on a software framework such as an object-based framework. In such a framework, entities may be based on pre-defined classes to facilitate modeling and simulation. A commercially available example of an object-based framework is the MICROSOFT® .NET™ framework (Redmond, Wash.), which provides a set of extensible object classes. In the .NET™ framework, an object class encapsulates a module of reusable code and associated data structures. Object classes can be used to instantiate object instances for use in by a program, script, etc. For example, borehole classes may define objects for representing boreholes based on well data.

In the example of FIG. 1, the simulation component 120 may process information to conform to one or more attributes specified by the attribute component 130, which may include a library of attributes. Such processing may occur prior to input to the simulation component 120. Alternatively, or in addition to, the simulation component 120 may perform operations on input information based on one or more attributes specified by the attribute component 130. According to an embodiment, the simulation component 120 may construct one or more models of the geologic environment 150, which may be relied on to simulate behavior of the geologic environment 150 (e.g., responsive to one or more acts, whether natural or artificial). In the example of FIG. 1, the analysis/visualization component 142 may allow for interaction with a model or model-based results. Additionally, or alternatively, output from the simulation component 120 may be input to one or more other workflows, as indicated by a workflow component 144. Further, dotted lines indicate possible feedback within the management components 110. For example, feedback may occur between the analysis/visualization component 142 and either one of the processing components 116 and 140.

According to an embodiment, the management components 110 may include features of a commercially available simulation framework such as the PETREL® seismic to simulation software framework (Schlumberger Limited, Houston, Tex.). The PETREL® framework provides components that allow for optimization of exploration and development operations. The PETREL® framework includes seismic to simulation software components that can output information for use in increasing reservoir performance, for example, by improving asset team productivity. Through use of such a framework, various professionals (e.g., geophysicists, geologists, and reservoir engineers) can develop collaborative workflows and integrate operations to streamline processes. Such a framework may be considered an application and may be considered a data-driven application (e.g., where data is input for purposes of simulating a geologic environment).

According to an embodiment, the management components 110 may include features for geology and geological modeling to generate high-resolution geological models of reservoir structure and stratigraphy (e.g., classification and estimation, facies modeling, well correlation, surface imaging, structural and fault analysis, well path design, data analysis, fracture modeling, workflow editing, uncertainty and optimization modeling, petrophysical modeling, etc.). Particular features may allow for performance of rapid 2D and 3D seismic interpretation, optionally for integration with geological and engineering tools (e.g., classification and estimation, well path design, seismic interpretation, seismic attribute analysis, seismic sampling, seismic volume rendering, geobody extraction, domain conversion, etc.). As to reservoir engineering, for a generated model, one or more features may allow for simulation workflow to perform streamline simulation, reduce uncertainty and assist in future well planning (e.g., uncertainty analysis and optimization workflow, well path design, advanced gridding and upscaling, history match analysis, etc.). The management components 110 may include features for drilling workflows including well path design, drilling visualization, and real-time model updates (e.g., via real-time data links).

According to an embodiment, various aspects of the management components 110 may be add-ons or plug-ins that operate according to specifications of a framework environment. For example, a commercially available framework environment marketed as the OCEAN® framework environment (Schlumberger Limited, Houston, Tex.) allows for seamless integration of add-ons (or plug-ins) into a PETREL® framework workflow. The OCEAN® framework environment leverages .NET® tools (Microsoft Corporation, Redmond, Wash.) and offers stable, user-friendly interfaces for efficient development. According to an embodiment, various components may be implemented as add-ons (or plug-ins) that conform to and operate according to specifications of a framework environment (e.g., according to application programming interface (API) specifications, etc.).

FIG. 1 also shows an example of a framework 170 that includes a model simulation layer 180 along with a framework services layer 190, a framework core layer 195 and a modules layer 175. The framework 170 may be the commercially available OCEAN® framework where the model simulation layer 180 is the commercially available PETREL® model-centric software package that hosts OCEAN® framework applications. According to an embodiment, the PETREL® software may be considered a data-driven application.

The model simulation layer 180 may provide domain objects 182, act as a data source 184, provide for rendering 186 and provide for various user interfaces 188. Rendering 186 may provide a graphical environment in which applications can display their data while the user interfaces 188 may provide a common look and feel for all application user interface components.

In the example of FIG. 1, the domain objects 182 can include entity objects, property objects and optionally other objects. Entity objects may be used to geometrically represent wells, surfaces, reservoirs, etc., while property objects may be used to provide property values as well as data versions and display parameters. For example, an entity object may represent a well where a property object provides log information as well as version information and display information (e.g., to display the well as part of a model).

In the example of FIG. 1, data may be stored in one or more data sources (or data stores, generally physical data storage devices), which may be at the same or different physical sites and accessible via one or more networks. The model simulation layer 180 may be configured to model projects. As such, a particular project may be stored where stored project information may include inputs, models, results and cases. Thus, upon completion of a modeling session, a user may store a project. At a later time, the project can be accessed and restored using the model simulation layer 180, which can recreate instances of the relevant domain objects.

Figure 2:
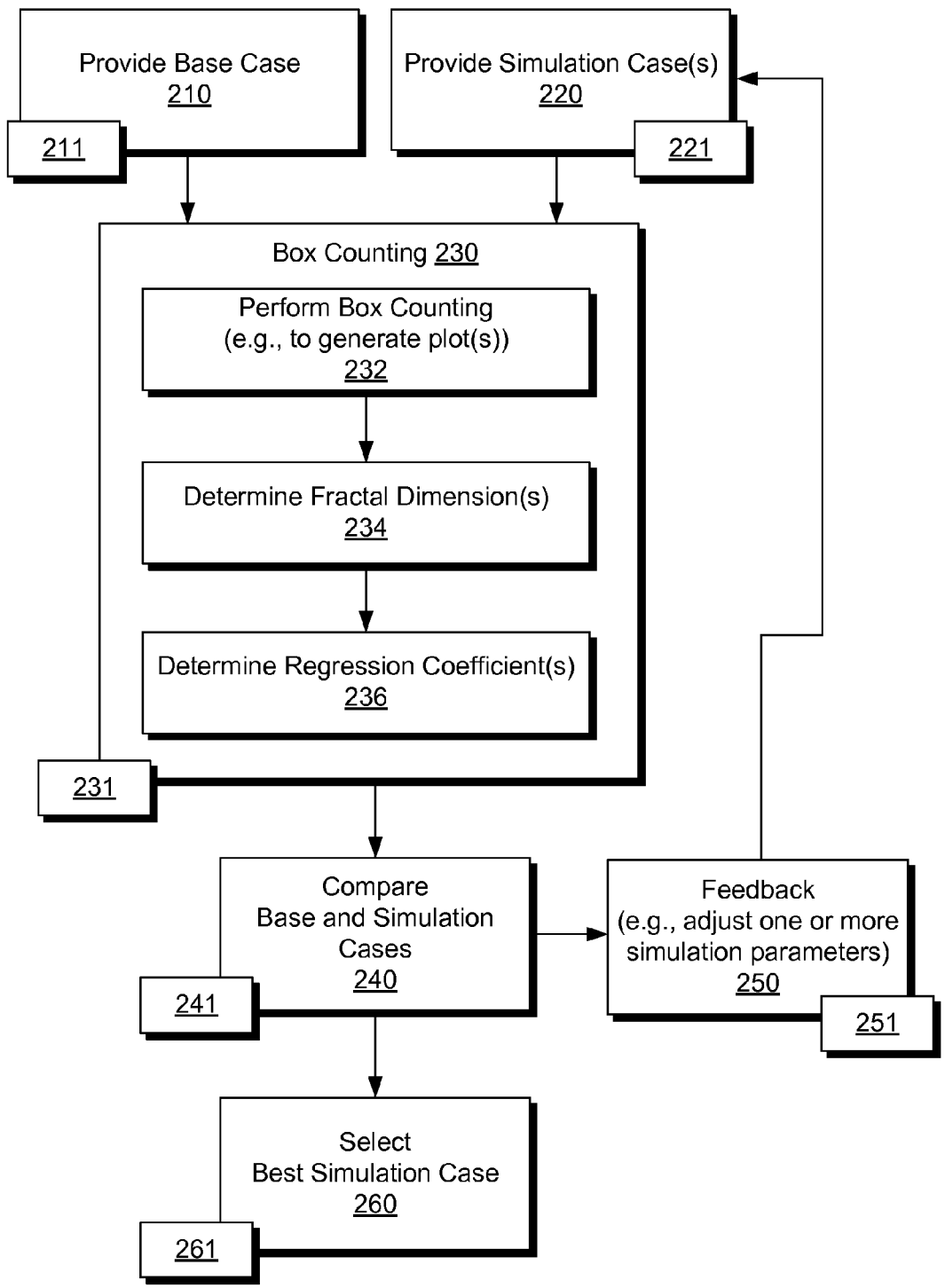
FIG. 2 illustrates an example of method that include performing box counting on data of a base case and data of one or more other cases.

FIG. 2 shows an example of a method 200 that includes performing box counting to compare various cases. As shown, the method 200 includes a provision block 210 to provide a base case and a provision block 220 to provide one or more simulation cases. A box counting block 230 for performing box counting can receive data of the base case and data of the one or more simulation cases. The box counting block 230 can perform box counting according to a process that includes a performance block 232 to perform box counting (e.g., and analyze one or more box counting plots), a determination block 234 to determine one or more fractal dimensions and a determination block 236 to determine one or more regression coefficients. According to an embodiment, a fractal dimension value and a regression coefficient value may be parameter values that characterize data, for example, that provide a signature or fingerprint of the data.

As an example of implementing the method 200, consider a scenario where the box counting block 230 performs a block counting process on data of a base case, where the base case represents an optimal or near optimal case, and outputs one or more metrics that characterize the base case (e.g., a fractal dimension value and a regression coefficient value). Given such a base case, a user may desire the ability to generate results via simulation that are characteristically as close as possible to the base case. Accordingly, a simulator may be implemented to generate a number of simulation cases, for example, to be provided to the box counting block 230 per the provision block 220. The box counting block 230 may then perform a block counting process on each one of the simulation cases and output metrics (e.g., one or more parameter values) that characterize each of the simulation cases.

As shown in the example of FIG. 2, given box counting based metrics for the base case and the simulation cases, a comparison block 240 can perform a comparison based on these metrics. Such a comparison may include ranking each of the simulation cases based on its respective characteristic "closeness" to the base case. For example, given two metrics that characterize each case, the metrics may be plotted on a 2D plot and the simulation cases may be ranked based on Euclidean distance from the base case. Such an approach may apply to a single metric or to more than two metrics, as dimensionality does not impede a "closeness" comparison. Further, according to an embodiment, weighting may be implemented to weight one or more metrics with respect to other metrics. For example, a regression coefficient may be of lesser meaning or significance than fractal dimension, accordingly an equation may be employed that provides a single metric as a function of fractal dimension multiplied by a first weight and regression coefficient multiplied by a second weight where the second weight is less than the first weight. In turn, metrics may be compared along a single dimension (e.g., plotted along a line).

The method 200 of FIG. 2 may proceed to a selection block 260 that selects a best simulation case based on output of the comparison block 240 or, alternatively or additionally, the method 200 may proceed to a feedback block 250 where output from the comparison block 240 serves as feedback to the provision block 220 to provide one or more additional simulation cases. For example, the feedback block 250 may provide or adjust one or more simulation parameters for generation of additional simulation cases). Accordingly, the method 200 may operate in an iterative manner to achieve an optimal result. For example, the comparison block 240 may include an error limit that once a difference between a base case metric (or metrics) and a simulation case metric (or metrics) falls below that limit, the method 200 terminates in the selection block 260.

As to visual inspection to validate results, if the data lends itself to such inspection, the method 200 may include a render block that renders information to a display, for example, at a level of the box counting block 230, the comparison block 240, the feedback block 250 or the selection block 260. Upon rendering, a graphic or other control may be available to a user to interact with the method, for example, to allow the method to proceed, to terminate, to repeat one or more blocks, etc. For example, if none of the simulation cases appear close to the base case, a user may simply terminate the method and perform additional simulations using simulation parameter values based on experience, help instruction, input from others, etc. After such simulations, the method may be reinitiated.

The method 200 is shown in FIG. 2 in association with various computer-readable media (CRM) blocks 211, 221, 231, 241, and 251. Such blocks generally may include instructions suitable for execution by one or more processors (or cores) to instruct a computing device or system to perform one or more actions. While various blocks are shown, a single medium may be configured with instructions to allow for, at least in part, performance of various actions of the method 200.

According to an embodiment, a method can include providing spatial data for a base case of a subsurface geologic formation; providing spatial data for a simulation case of the subsurface geologic formation; performing box counting for the spatial data for the base case; performing box counting for the spatial data for the simulation case; based on the box counting for the spatial data for the base case, determining a fractal dimension for the base case; based on the box counting for the spatial data for the simulation case, determining a fractal dimension for the simulation case; comparing the simulation case to the base case based at least in part on the fractal dimensions; and, based on the comparing, adjusting one or more simulation parameters to generate spatial data for an additional simulation case of the subsurface geologic formation. In such a method, the providing spatial data for a base case can optionally include providing seismic data for the subsurface geologic formation.

According to an embodiment, a method can include determining a fractal dimension for a base case and determining a fractal dimension for a simulation case and determining a regression coefficient corresponding to a relationship between a characteristic of a box counting shape and a number of the shapes occupied by a spatial data feature. As to a characteristic of a box counting shape, this may be a size dimension, an area dimension or other dimension related to how the shape covers or occupies one or more dimensions in the spatial domain of the data.

According to an embodiment, spatial data for a base case and spatial data for a simulation case may be one-dimensional spatial data, spatial data for at least a base case may be multi-dimensional spatial data, or dimensionality of a box counting shape may differ from dimensionality of spatial data of a base case.

According to an embodiment, a method can include generation of an optimal case as a seismic section, an image representing a positive or a negative result, an image, or a properties map on a 2D data case, a seismic volume or a 3D properties volume in a 3D data case, etc. Such a generation process may generate an optimized case (e.g., a seismic interpreted section or a user drawn map) that can be used to extract optimal case parameters (e.g., a fractal dimension value) when running a box counting process.

According to an embodiment, a box counting process can produce a cross plot and a fractal dimension value. Further, a regression coefficient may be calculated. Such a process can be carried out in 1, 2 or 3 dimensions to generate a box counting cross plot, a fractal dimension value and a regression coefficient for data.

As mentioned, cases may be provided for comparison to an optimal case. Such cases may be simulation cases, processed data cases, different measured data cases, etc. For example, processed data cases may be based on the same actual data of the optimal case but with filtering applied, a different transform applied, etc.; whereas, for different measured data cases, data may be provided that was acquired at a different time, by a different person, using different equipment, etc. Accordingly, a comparison need not necessarily involve simulation cases (e.g., the block 220 of the method 200 may provide cases other than simulation cases). Some examples of techniques for case generation or case variation include seismic processing techniques, image enhancement techniques, and property modeling techniques.

According to an embodiment, different cases can be analyzed via box counting where resulting parameter values can be compared with one or more values for an optimal case. Feedback may be possible based on a comparison, for example, to adjust control variables for one or more additional simulations, enhancements, data acquisitions, etc., in an effort to reduce the difference in parameter values. For example, where data acquisition is involved, an instruction may be communicated to a field engineer or to field equipment that instructs the engineer or equipment to acquire additional data (or replacement data). Such a process may include one or more parameter values (e.g., equipment settings) in an effort to increase reliability or accuracy of the data to be acquired.

According to an embodiment, a method can include generation of an optimal case, running a box counting process for the optimal case and storing parameter values, running a box counting process using initialized random values of variables for an additional case and storing parameter values for the additional case, and providing information as to the difference between the parameter values for the optimal case and the additional case. Such a method may be repeated until the difference is acceptable (e.g., based on a predetermined error limit, a failure to reduce error upon a subsequent iteration or iterations, etc.).

In an embodiment, a method can include box counting and fractal analysis as tools to synthesize complex information of a 2D image (e.g., seismic cross section, map) or a 3D properties volume (e.g., seismic volume, properties volume) into a number of parameters, data or both parameters and data. Such parameters and data may be relatively simple to calculate and optionally visualize and thereby provide for synthesizing complex information into less complex information that may be more easily understood (e.g., via visual or other inspection). As examples, parameters can include a box counting cross plot (e.g., resulting from 1D, 2D and 3D box counting), a fractal dimension value (e.g., resulting from 1D, 2D and 3D box counting), a regression coefficient as a value of fit between data of a cross plot and a linear regression (e.g., resulting from 1D, 2D and 3D box counting).

Such a synthesis, from a complex spatial distribution to relatively simple parameters, allows one to resolve, for example, the problem of optimizing the parameters of an image enhancement process by using some simple parameters as quality control for this process instead of using a full image visual comparison.

Figure 3:
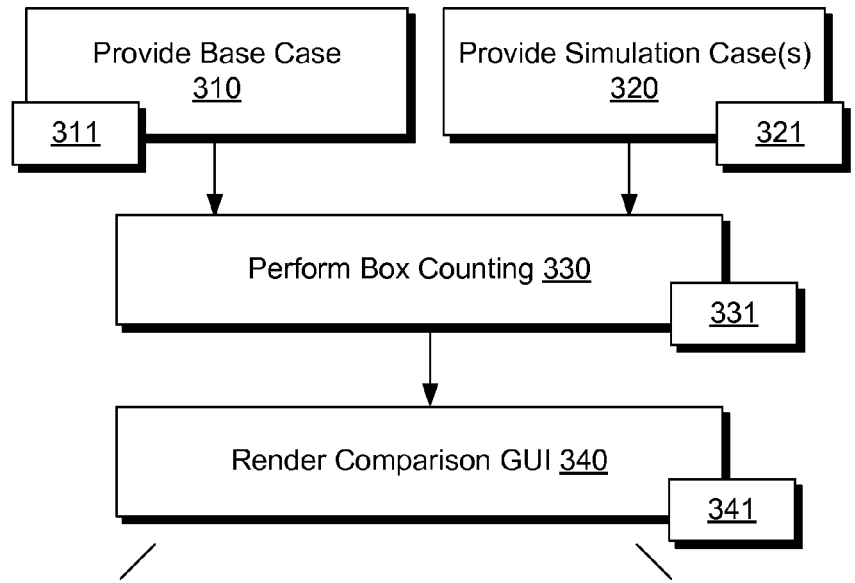
FIG. 3 illustrates an example of method and a graphical user interface to compare data for various cases based at least in part on box counting.
Figure 3:
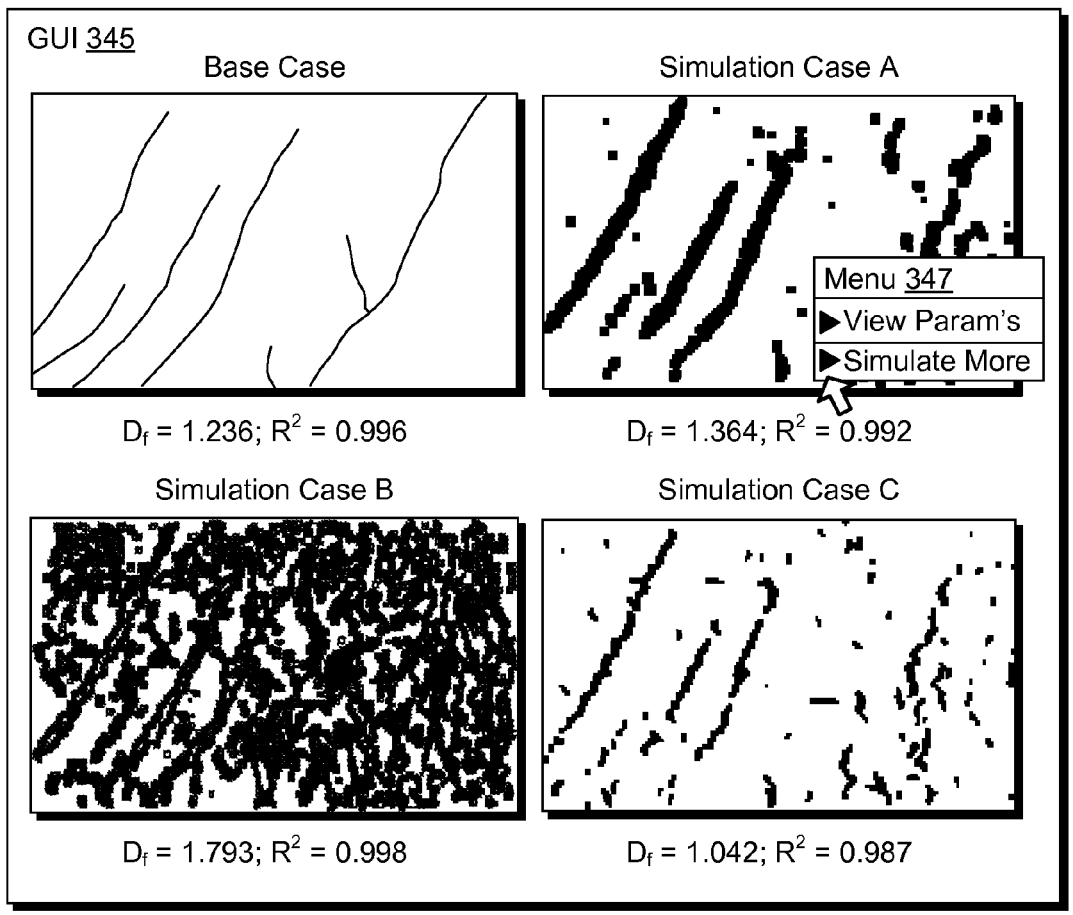

FIG. 3 shows an example of a method 300 along with a graphical user interface (GUI) 345 that provides for rendering information to a display for visual inspection and user interaction. The method 300 includes provision blocks 310 and 320 for providing a base case and one or more simulation cases. As shown, a performance block 330 performs box counting on the cases provided by the provision blocks 310 and 320 and a render block 340 renders a comparison GUI such as the GUI 345 to a display for a visual comparison and optionally user interaction.

In the example of FIG. 3, the GUI 345 renders a base case and three simulation cases A, B and C. For each case, two metrics are presented along with a visual representation of associated data. In this particular example, the metrics are fractal dimension $D_f$ and regression coefficient $R^2$. Upon visual inspection, a user may deem simulation case A as the best of the simulation cases (i.e., closest to the base case). Such an interpretation may be confirmed or identified as being of increased confidence based on a comparison of the metrics, particularly the fractal dimension values (e.g., $D_f$ for Case A is 1.364 and closest to $D_f$ for the base case, which is 1.236).

In the example of FIG. 3, the GUI 345 further includes a graphic control menu 347 that allows for user interaction, for example, to view parameters and optionally simulate more cases like a particular case (e.g., such as simulation case A).

For example, a user may select the best of the simulation cases and then initiate further simulation of cases based on the best (e.g., "simulate more like this"). Such an approach may use one or more values of the best simulation case as a seed value that can be used to generate values for additional simulations (e.g., via a process that randomly generates values about a seed value).

The method 300 is shown in FIG. 3 in association with various computer-readable media (CRM) blocks 311, 321, 331, and 341. Such blocks generally include instructions suitable for execution by one or more processors (or cores) to instruct a computing device or system to perform one or more actions. While various blocks are shown, a single medium may be configured with instructions to allow for, at least in part, performance of various actions of the method 300 and generation of a GUI such as the GUI 345 and its graphic control menu 347.

Figure 4:
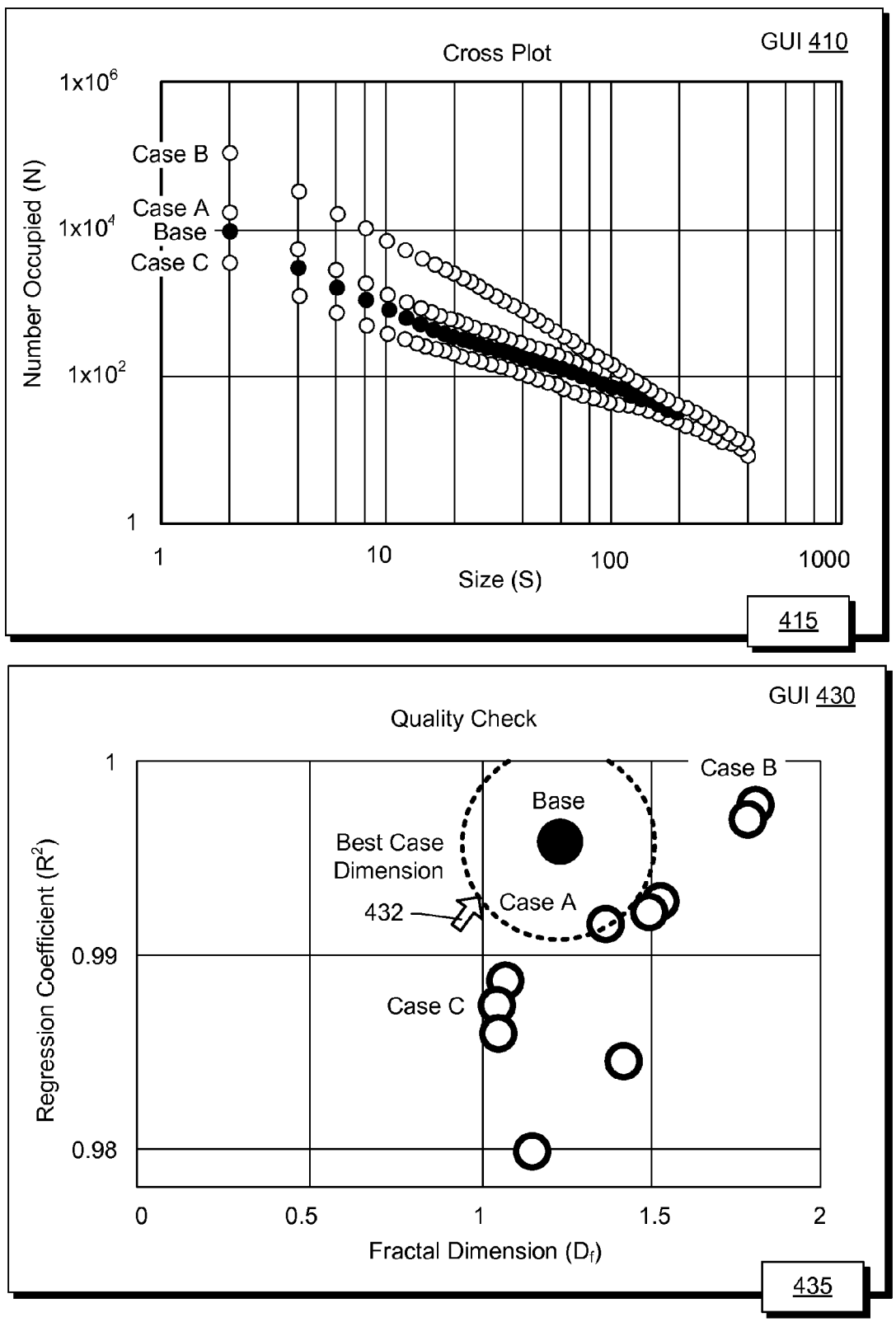
FIG. 4 illustrates examples of graphical user interfaces for analyzing output of box counting applied to various data sets.

FIG. 4 shows examples of two GUIs 410 and 430 associated with data of the example of the GUI 345 of FIG. 3. In the GUI 410, number of occupied shapes (e.g., boxes) is plotted versus size of shapes (e.g., boxes) on log axes. As shown in the example of FIG. 4, the simulation case A is the closest to the base case (e.g., with respect to position and slope). The GUI 430 allows for a quality check by plotting the regression coefficient versus the fractal dimension for various simulation cases that include A, B and C, as well as other cases (e.g., other open circles). Accordingly, the cross plot may show a select number of cases, based on proximity or one or more other criteria. A GUI such as the GUI 430 may include graphic controls to allow for user interaction, for example, to illustrate a dimensional neighborhood about a base case to more readily see which simulation cases are near or within that neighborhood. For example, a graphic control 432 may allow for rendering of a dashed circle and optionally specific information as to the neighborhood defined by the circle (e.g., distance, distance along fractal dimension axis, distance along regression coefficient axis, etc.). Such a GUI may also provide a control that allows a user to select a simulation case (e.g., click on a data marker) and to automatically initiate simulation of one or more additional cases based on the selected simulation case (see, e.g., the control menu 347 of FIG. 3).

The GUIs 410 and 430 are shown in FIG. 4 in association with various computer-readable media (CRM) blocks 415 and 435. Such blocks generally include instructions suitable for execution by one or more processors (or cores) to instruct a computing device or system to perform one or more actions. While various blocks are shown, a single medium may be configured with instructions to allow for, at least in part, performance of various actions such as generation of GUIs such as the GUIs 410 and 430 and its graphic control 432.

Figure 5:
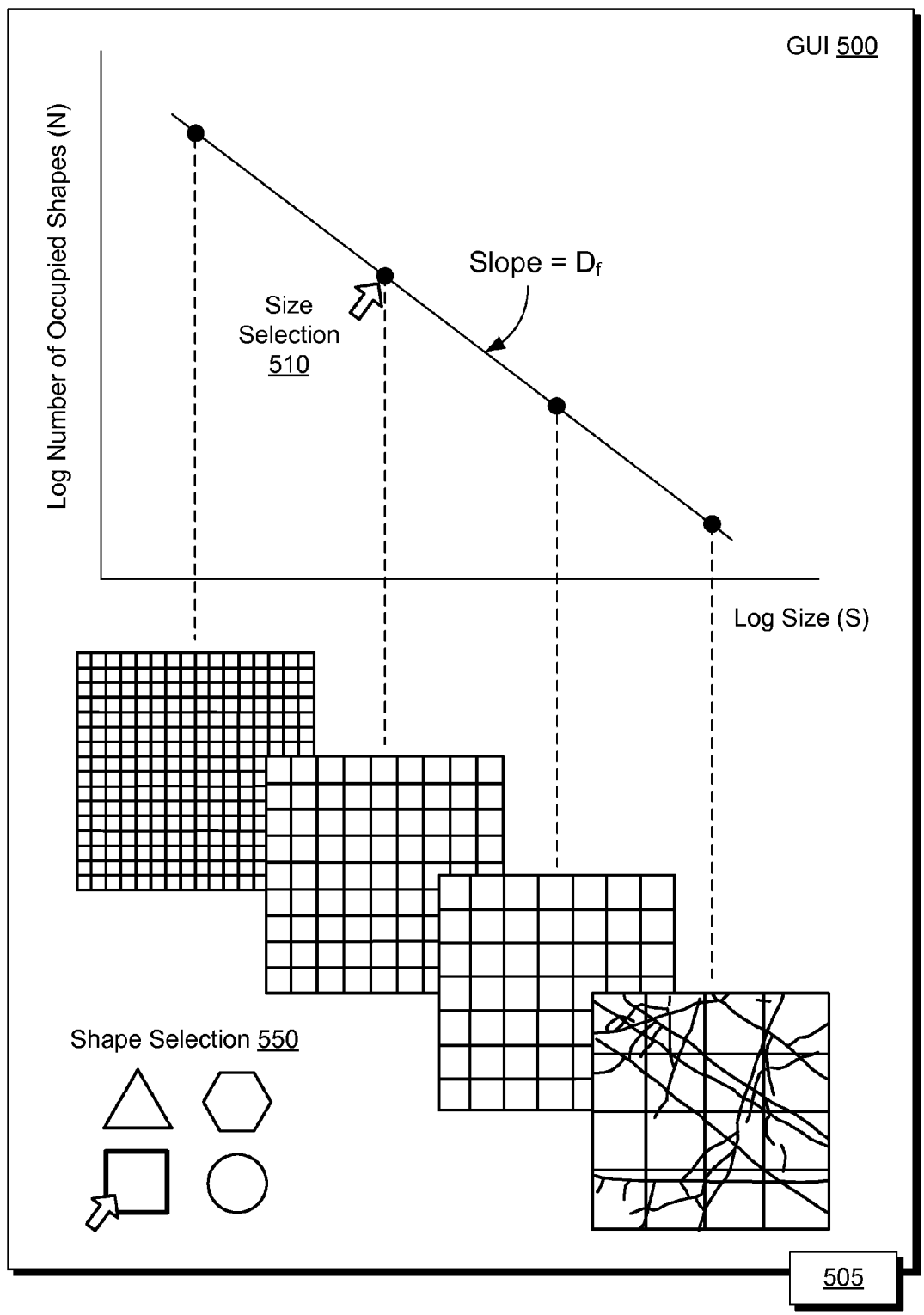
FIG. 5 illustrates an example of a graphical user interface for setting up a box counting process.

FIG. 5 shows an example of a GUI 500 to provide for setting up a box counting process. In the example of FIG. 5, the GUI 500 includes an ideal plot of log of shape size versus log number of occupied shapes. The GUI 500 can include a size selection control 510 that allows a user to select one or more shape sizes (e.g., box grid size) and can include a shape selection control 550 that allows a user to select one or more shapes. While a rectangular grid is shown in the example of FIG. 5, according to an embodiment, box counting may be performed using any of a variety of shapes, whether two-dimensional or of higher dimension. As shown, 2D shapes can include squares, triangles, hexagons, circles, etc. In 3D, shapes may include tetrahedra, cubes, spheres, etc.

The GUI 500 is shown in FIG. 5 in association with a computer-readable medium (CRM) block 505. Such a block generally includes instructions suitable for execution by one or more processors (or cores) to instruct a computing device or system to perform one or more actions such as generation of a GUI such as the GUI 500 and its associated controls 510 and 550.

Figure 6:
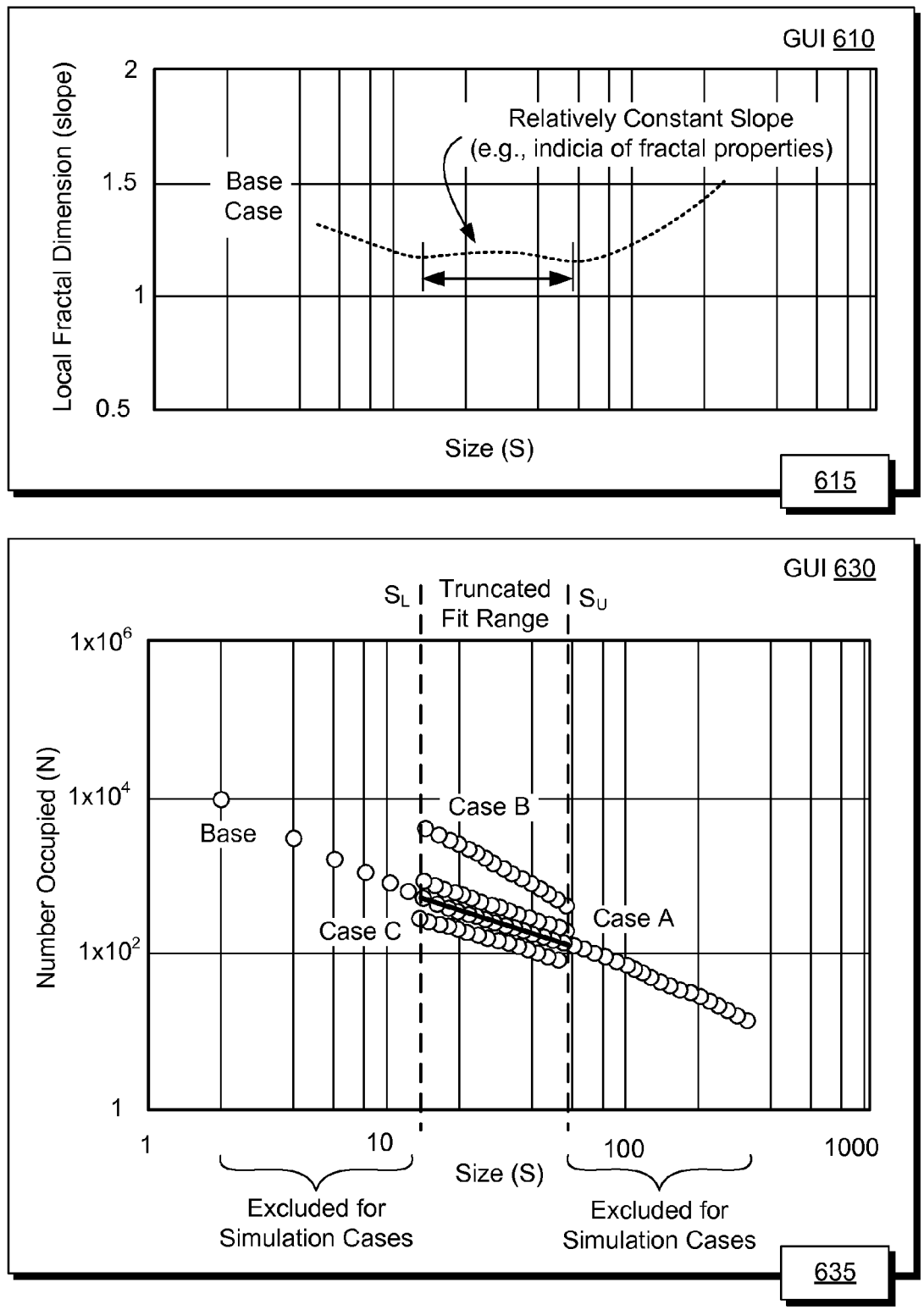
FIG. 6 illustrates examples of graphical user interfaces for box counting analyses.

FIG. 6 shows examples of two GUIs 610 and 630 that can optionally enhance performance of a box counting process. The GUI 610 shows a plot of local fractal dimension versus log of size for a base case such as the base case of the example of FIGS. 3 and 4. In such a plot, if a data set has some fractal properties over a limited range of box size S, this may be appreciated by plotting the local fractal dimension (e.g., the slope of a log-log plot of number occupied versus size).

In the example of FIG. 6, the base case exhibits a relatively constant local fractal dimension over a particular range of sizes. Accordingly, when performing box counting on simulation cases, sizes less than and greater than those of the range may be excluded, which, in turn, reduces computational requirements for box counting. In such a manner, many simulation cases may be analyzed via box counting over a size range that is based on some indicia of fractal properties of the base case. Such an approach can be beneficial if the fractal properties are of particular interest, for example, associated with a property or a feature (e.g., a subsurface formation such as a fault, a resource, etc.).

The GUI 630 illustrates a truncated fit range between a lower size limit $S_L$ and an upper size limit $S_U$. In this example, fit corresponds to a fit range for a regression analysis (e.g., a straight line regression analysis to provide a regression coefficient).

The GUIs 610 and 630 are shown in FIG. 6 in association with various computer-readable media (CRM) blocks 615 and 635. Such blocks generally include instructions suitable for execution by one or more processors (or cores) to instruct a computing device or system to perform one or more actions such as generation of a GUI such as the GUIs 615 and 635 and any associated controls.

Figure 7:
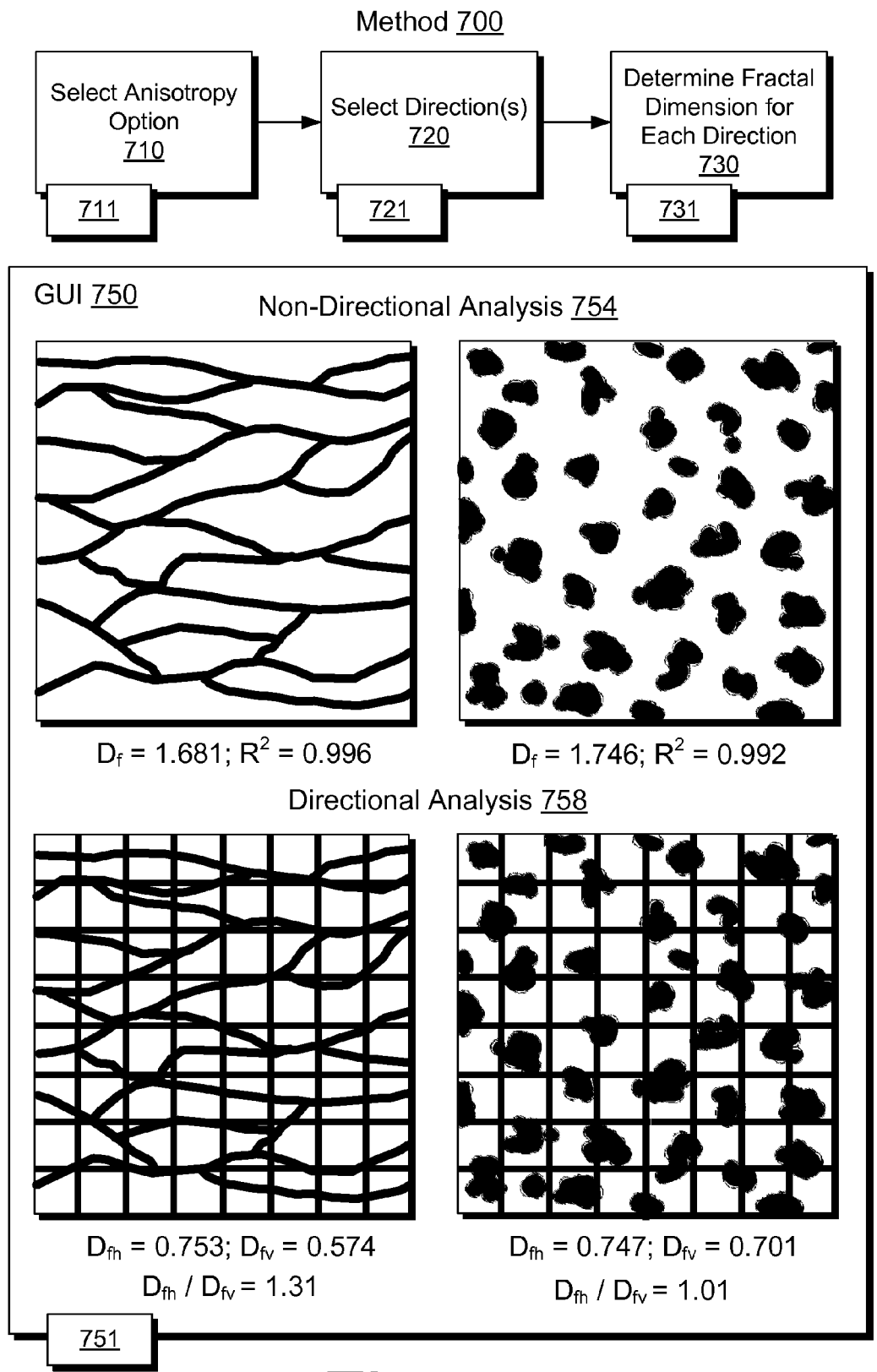
FIG. 7 illustrates an example of a method and an example of a graphical user interface to perform an anisotropic analysis of data sets.

FIG. 7 shows an example of a method 700 and an example of a GUI 750 for performing a non-directional analysis 754 and a directional analysis 758. In the example of FIG. 7, the method 700 can provide for analysis of data with respect to one or more directions via an option selection block 710, a direction selection block 720 and a determination block 730 for determining fractal dimension for each selected direction. For example, a user may select an anisotropic or directional analysis option, which may initiate rendering of a graphical control that provides for selection of one or more directions to perform box counting or otherwise analyze box counting results with respect to direction. In such an example, given one or more selected directions, fractal dimensions for each of the one or more directions may be output, optionally graphically along with additional information that may assist with a visual analysis of data (e.g., data for various cases).

In the example of FIG. 7, the GUI 750 shows visual representations for two cases analyzed using the non-directional analysis 754 and the directional analysis 758 options. As indicated in the lower representations, a fractal dimension for vertical and horizontal directions have been determined as well as a ratio. According to an embodiment, a ratio or ratios or other metric that relies on directional fractal dimensions may indicate anisotropy or isotropy of data. As an example, a user may inspect 2D images such as those presented by the GUI 750 in conjunction with values, metrics, etc., to decide on subsequent action for an analysis or, more generally, for a workflow. As mentioned, subsequent action may include data acquisition, data enhancement, simulation, etc.

For the example GUI 750 of FIG. 7, 2D images for data sets were sliced into seven 1D lines equally distributed in a horizontal direction and in a vertical direction (e.g., directional lines). A box counting process to provide a fractal dimension was performed for each of the 1D lines for each image. Next, resulting fractal dimensions for the vertical lines were added and resulting fractal dimensions for the horizontal lines were added. Next, the sum for the vertical lines was divided by the number of vertical lines to provide an average fractal dimension for the vertical direction and the sum for the horizontal lines was divided by the number of horizontal lines to provide an average fractal dimension for the horizontal direction. As an example of a metric (e.g., indicative of isotropy), the average dimension for the horizontal direction was divided by the average dimension for the vertical direction. This metric is a ratio that may be an indicator of isotropy or anisotropy. For example, if this ratio is close to unity, then the data tends to be isotropic. Where the two directions are orthogonal, as in the example of FIG. 7, a ratio that deviates from unity may indicate that the data tends to be anisotropic. As shown in the example of FIG. 7, the features in the image on the right are more isotropic ($D_{fh}/D_{fv}=1.01$) than the features in the image on the left ($D_{fh}/D_{fv}=1.31$), which tends to be more anisotropic.

According to an embodiment, a prominent direction for anisotropic data may be indicated by comparing magnitudes of box counting dimensions for various directions. For example, the image on the left appears to have more horizontal features than vertical features and the fractal dimension for the horizontal lines exceeds the fractal dimension for the vertical lines. Such fractal values, or metrics based thereon, may be provided as input to a process, for example, to reduce number of iterations, reduce process time, etc. (e.g., where a single direction provides for acceptable comparison, use of that single direction may act to optimize a process). According to an embodiment, a method may perform box counting for a number of directions (e.g., angles selected from 0 degrees to 179 degrees) and then compare fractal dimensions for the directions to determine a prominent direction. Once determined, a prominent direction may be relied on to characterize data or to perform one or more additional actions (e.g., adjustment of one or more variables for generation of test cases, etc.).

The method 700 and the GUI 750 are shown in FIG. 7 in association with various computer-readable media (CRM) blocks 711, 721, 731 and 751. Such blocks generally include instructions suitable for execution by one or more processors (or cores) to instruct a computing device or system to perform one or more actions. While various blocks are shown, a single medium may be configured with instructions to allow for, at least in part, performance of various actions of the method 700 and generation of a GUI such as the GUI 750.

Figure 8:
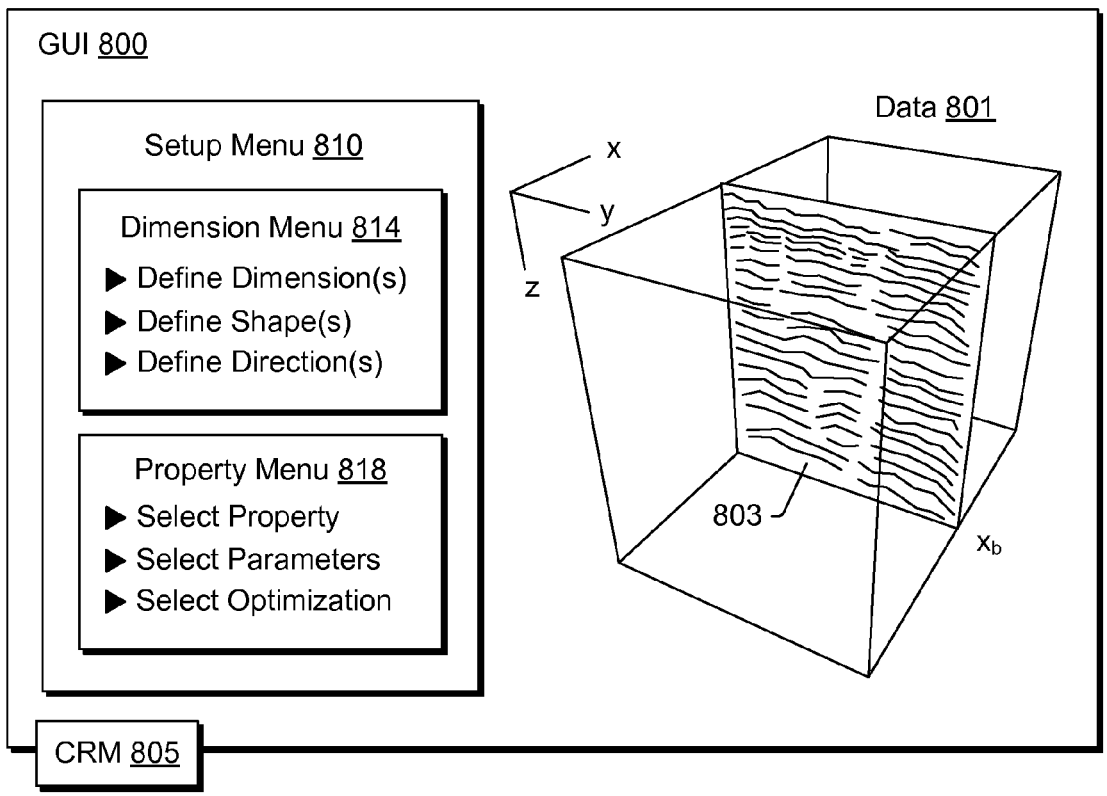
FIG. 8 illustrates examples of graphical user interfaces for setting up a process that includes box counting.
Figure 8:
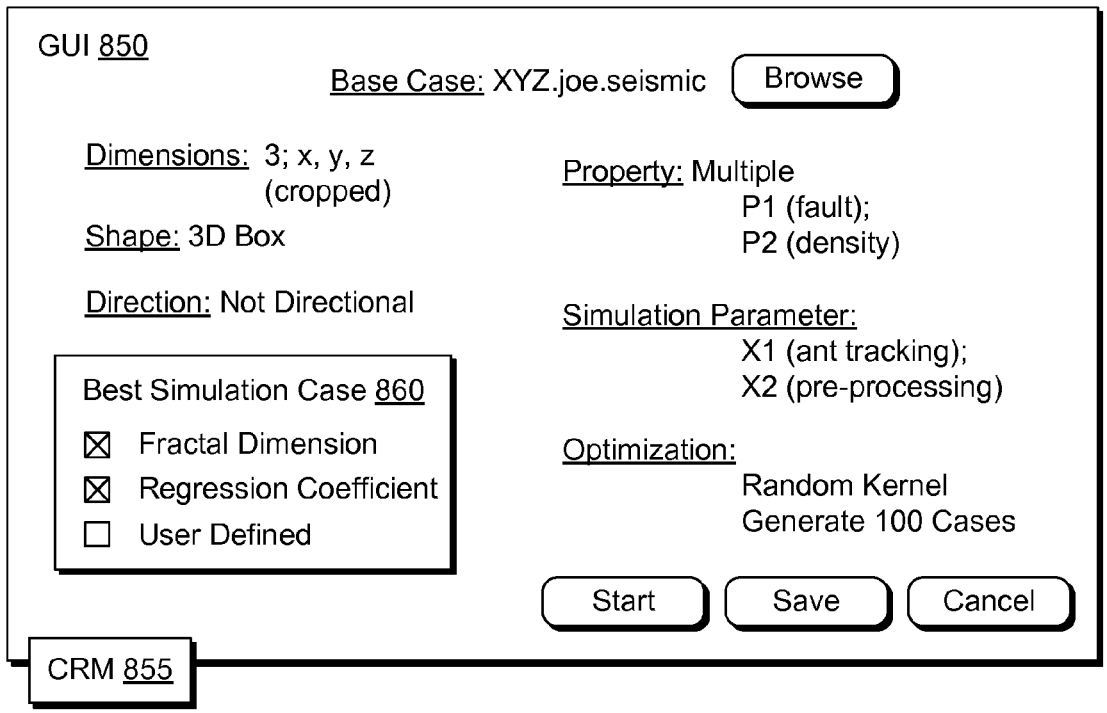

FIG. 8 shows examples of GUIs 800 and 850 that provide for setting up and performing box counting. The GUI 800 shows a visual representation of data 801, which may be multidimensional data and visible via slicing to show a 2D slice 803 for a selected plane. The GUI 800 also includes a setup menu 810 with submenus for dimensions 814 and properties 818. The dimension menu 814 may allow for input by a user to define one or more dimensions, define one or more shapes, define one or more directions, etc., for purposes of box counting. The property menu 818 may allow for input by a user to select one or more properties, select one or more parameters, select an optimization process, etc., for purposes of box counting.

In the example of FIG. 8, once menu options have been set, the GUI 850 may provide a visual summary of information and controls for further actions. For example, the GUI 850 may include a base case selection tool that allows a user to browse storage locations to load data associated with a base case. As to a summary of information, a dimension field may indicate that 3D data has been selected and cropped, a shape field may indicate that 3D boxes (e.g., volume elements or voxels) have been selected as box counting shapes, a direction field may indicate whether a direction or directions associated with isotropic or anisotropic options have been selected, a property field may indicate what property or properties in a data set have been selected, a simulation parameter field may indicate whether enhancement or simulation techniques have been applied or are to be applied to data, and an optimization field may indicate a technique for generation and a number of additional cases to generate, for example, based on a best to base case comparison. Further, the GUI 850 may include a graphic control 860 that allows for input and receipt of instructions as to what constitutes a best case. More specifically, in the example of FIG. 8, the GUI 860 allows a user to select one or more parameters or to define a parameter for use in assessing box counting results. Yet further, the GUI 850 may include various graphical controls to perform functions such as start a process, save a set up or cancel a set up.

The GUIs 800 and 850 are shown in FIG. 8 in association with various computer-readable media (CRM) blocks 805 and 855. Such blocks generally include instructions suitable for execution by one or more processors (or cores) to instruct a computing device or system to perform one or more actions such as generation of a GUI such as the GUIs 800 and 850 and any associated controls.

Figure 9:
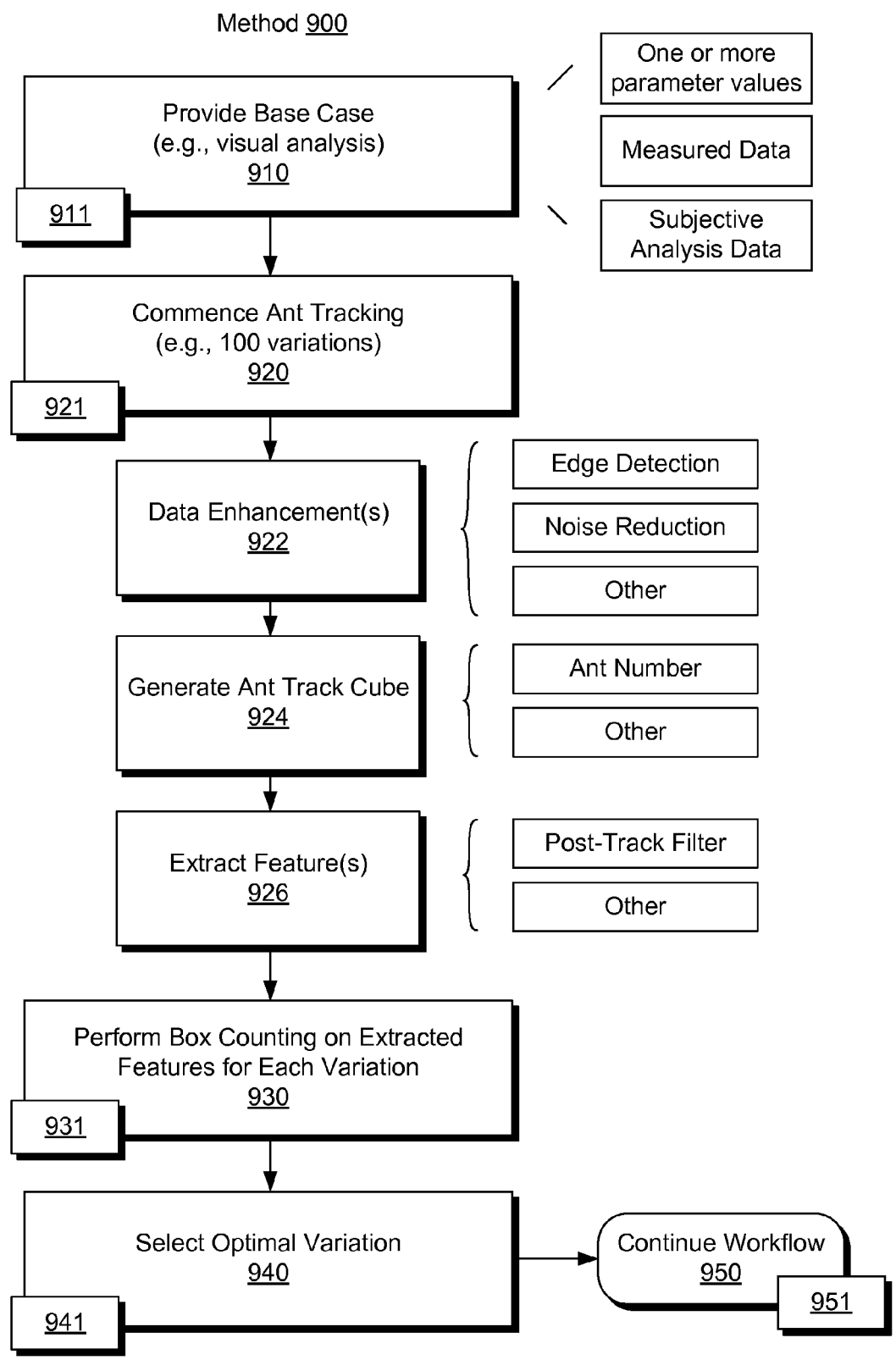
FIG. 9 illustrates an example of a method that includes ant tracking and box counting.

FIG. 9 shows an example of a method 900 that performs a box counting analysis on data enhanced by ant tracking. The method 900 includes a provision block 910 for providing a base case, a commencement block 920 for commencing an ant tracking process to generate various cases, a performance block 930 for performing box counting on ant tracking enhanced data and a selection block 940 for selecting an optimal one of the cases. Thereafter, the method 900 may continue to a subsequent or parallel workflow process.

According to an embodiment, ant tracking may be a semi-automated or automated option for structural interpretation of data such as seismic data. As an example, ant tracking can be used to increase accuracy while reducing subjective manual fault interpretation burdens when seeking to understand trends of fault surfaces and fluid flow properties across fault systems for reservoir characterization.

In the example of FIG. 9, a process for ant tracking may include a data enhancement block 922 to enhance data (e.g., via edge detection, noise reduction, etc.), a generation block 924 to generate an ant track cube (e.g., based on ant number, etc.), and an extraction block 926 to extract ant tracked features (e.g., via post-track filtering, etc.). Accordingly, an ant tracking process can include various parameters that require judicious selection to produce an acceptable result. According to an embodiment, the method 900 can assist with parameter selection and optionally reduce manual intervention whether for selecting parameters or for visually analyzing results.

In the example of FIG. 9, the base case may be a data set to which variations of ant tracking are applied. Further, providing a base case may also provide a base case parameter value or values for use in selecting an optimal variation of the ant tracking variations. For example, providing a base case may include providing a data set that has been analyzed using a subjective process (e.g., an expert analysis) and thereafter an objective process such as box counting to determine a parameter value or values that characterize the subjective process. In selecting an optimal variation, one or more parameter values may be determined for each of the variations, based at least in part on box counting, and these values may be compared to each other, to a base case value or values or a combination thereof (e.g., to each other and a base case).

According to an embodiment, the method 900 is shown in FIG. 9 in association with various computer-readable media (CRM) blocks 911, 921, 931, 941, and 951. Such blocks generally include instructions suitable for execution by one or more processors (or cores) to instruct a computing device or system to perform one or more actions. While various blocks are shown, a single medium may be configured with instructions to allow for, at least in part, performance of various actions of the method 900.

According to an embodiment, one or more computer-readable media can include processor-executable instructions to instruct a computing system to: provide a data set; perform variations of a feature extraction process on the provided data set to generate test cases; perform box counting on the generated test cases to determine a parameter value for each of the test cases; and select an optimal test case based on a comparison of the parameter values of the test cases. In such an example, instructions may be included to instruct a computing system to provide a parameter value for an optimal case to aid in selection of an optimal test case. According to an embodiment, a feature extraction process may be ant tracking or another process. Where multiple parameter values are determined, instructions may be included to instruct a computing system to determine another parameter value for each of the test cases and to render a two-dimensional plot of the two parameters to a display.

Figure 10:
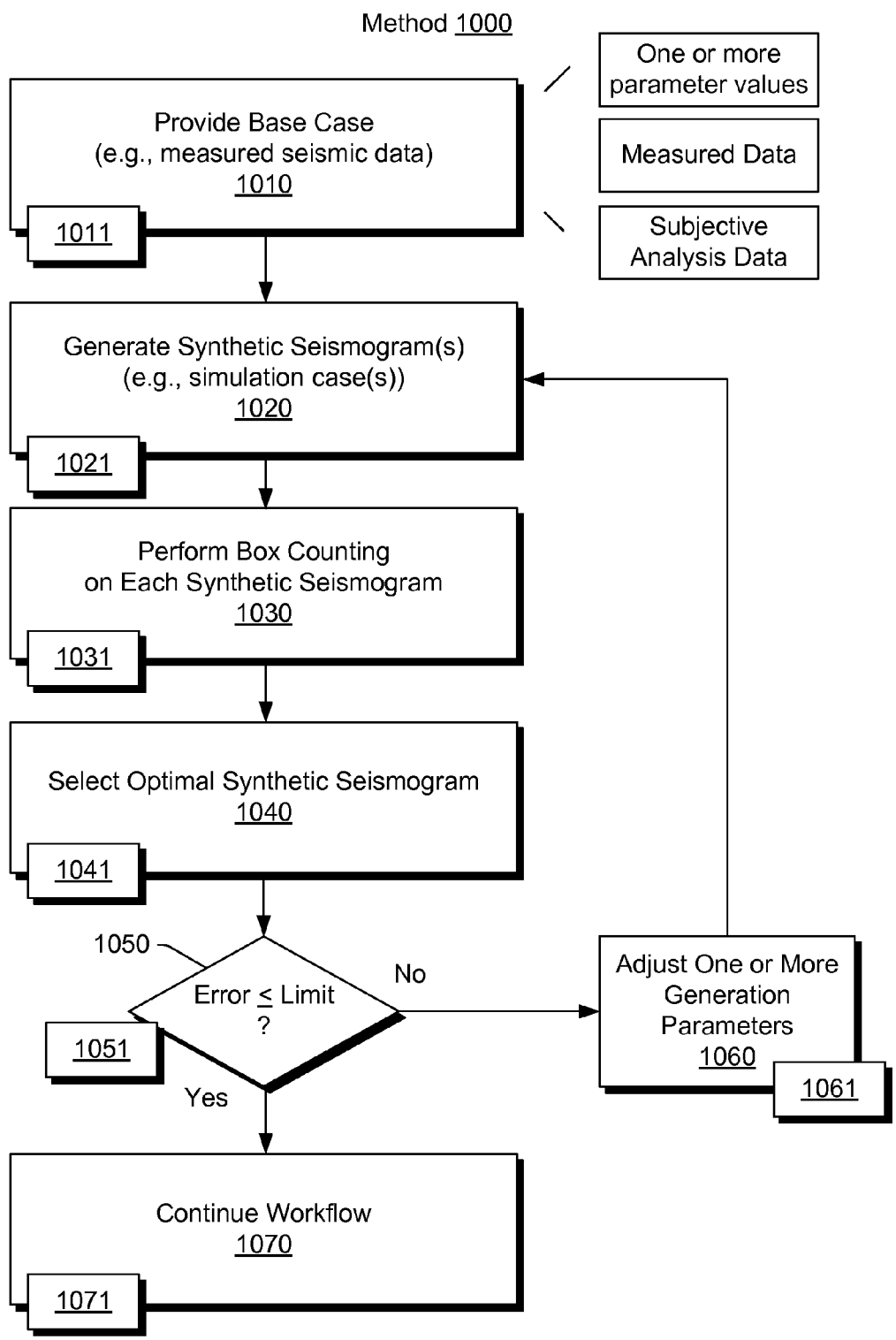
FIG. 10 illustrates an example of a method that includes synthetic seismogram generation and box counting.

FIG. 10 shows an example of a method 1000 that performs a box counting analysis on synthetic seismograms. The method 1000 includes a provision block 1010 for providing a base case, a generation block 1020 for generating one or more synthetic seismograms, a performance block 1030 for performing box counting on each generated synthetic seismogram, a selection block 1040 for selecting an optimal synthetic seismogram, a decision block 1050 for deciding whether an error is less than a limit and subsequent blocks 1060 and 1070, for adjusting one or more generation parameters or for continuing a workflow, respectively, depending on a decision made by the decision block 1050.

As to the provision block 1010, such a block may provide a base case as one or more parameter values, as measured data, as subjective analysis data, etc. As to one or more parameter values, these may be values that characterize a base case and that are determined, at least in part, by applying a box counting process to base case data. As to measured data, such data may be raw or processed data from measurements performed in a lab, in the field, etc. As to subjective analysis data or subjective process data, such data may be data resulting from a subjective analysis of other data, for example, via a visual analysis where manual interaction may be involved to enhance, identify, or extract features within the data. A subjective analysis may be considered an expert analysis, for example, when performed by a person with years of experience. According to an embodiment, various processes may be tailored based on results that stem, at least in part, from subjective, expert analyses.

A synthetic seismogram represents forward modeling of a seismic response of geologic model based at least in part on variations in actual physical properties of a geologic formation. A synthetic seismogram may be used, for example, to tie changes in rock properties in a borehole and seismic reflection data acquired via the borehole. A synthetic seismogram can also be used to test possible interpretation models seismic data or to model response of a predicted geology (e.g., optionally to aid planning of a survey). A synthetic seismogram process can optionally include wavelet extraction from seismic data where wavelet extraction involves trying various combinations of extraction parameters. As such a technique can include multiple case generation, a box counting process may be applied to facilitate case generation and selection of an optimal case.

According to an embodiment, the method 1000 is shown in FIG. 10 in association with various computer-readable media (CRM) blocks 1011, 1021, 1031, 1041, 1051 and 1061. Such blocks generally include instructions suitable for execution by one or more processors (or cores) to instruct a computing device or system to perform one or more actions. While various blocks are shown, a single medium may be configured with instructions to allow for, at least in part, performance of various actions of the method 1000.

According to an embodiment, one or more computer-readable media can include processor-executable instructions to instruct a computing system to: receive a parameter value for a base case; perform box counting on generated test cases to determine a parameter value for each of the test cases; select an optimal test case based on a comparison of the parameter values of the test cases and the parameter value of the base case; decide whether a difference between the parameter value of the selected optimal test case and the parameter value of the base case exceeds an error limit; adjust one or more generation parameters if the difference exceeds the error limit; and generate additional test cases based on one or more adjusted generation parameters. Such instructions may perform a method, for example, where a workflow continues if the difference does not exceed the error limit. Further, such instructions may include instructions to instruct a computing system to continue a workflow process if the difference does not exceed the error limit. According to an embodiment, a workflow process may optionally be a process associated with the geologic environment 150 of FIG. 1 (e.g., sensing, drilling, injecting, extracting, modeling, simulating, etc.).

According to an embodiment, box counting can be carried out in one or more dimensions (e.g., 1D or higher dimensionality) and optionally various directions. An image or a volume of a property may be used as input to a box counting process, for example, where the image or the volume is sliced in several 1D lines (horizontal, vertical or maximum and minimum continuity). A process can optionally include averaging fractal dimensions, where fractal dimensions for maximum continuity and minimum continuity directions may be calculated. An analysis can optionally include calculating a ratio of maximum and minimum continuity values.

According to an embodiment, a parameter for characterizing data may be lacunarity, which is a measure of how a fractal fills space. As a parameter, lacunarity can classify fractals and textures which, while sharing the same fractal dimension, appear visually different. In general, dense fractals have a low lacunarity and, as the coarseness of the fractal increases, so does the lacunarity (e.g., more and larger gaps give a higher lacunarity). Lacunarity of a data set can be calculated using, for example, a gliding box counting process. A gliding or sliding box counting process may be a point, pixel, voxel, etc., centered process that generates one or more histograms for determination of lacunarity (e.g., as a ratio of expectation values). In some instances, a linear relationship may exist between fractal dimension and lacunarity, for example: $D_f = A - B\lambda$, where $\lambda$ is lacunarity (see, e.g., Borys, P. "On the relation between lacunarity and fractal dimension", Acta Physica Polonica B, Vol. 40 (2009), which is incorporated by reference herein). According to an embodiment, such an equation, and optionally a regression coefficient thereof, may characterize data and be used for purposes of comparing cases.

According to an embodiment, various techniques can include a box counting process. As an example, consider creating an optimal case that represents an object with perfect set parameters and that is to be produced by a simulation process of a modeling application. In this example, the optimal case may be created manually (e.g., it may be a visual and manual interpretation of a seismic cross section). The optimal case may be considered an expert interpretation and stored in the form of a 2D image, available as an input pane for subsequent processing. As another example, a base case may be considered a training image for facies modeling.

Given an optimal case, a goal may be to create data as close as possible to the optimal case. The created data may be considered object data, where such objects and associated data are created using features of software such as the PETREL® software. An example of such object data is an ant tracking volume, which may be deemed similar to the optimal case when faults, as data features, align for the optimal case and the ant tracking volume. In this example, the optimal case may be provided via a visual and manual process, accordingly, similarity or alignment between optimal case data and object data does not necessarily mean same data type but rather same geological object as represented in the optimal case data and the created object data.

As mentioned, another example can include facies (e.g., represented by a facies property). In such an example, the optimal case may be represented by a 2D image data; noting that the objects created for a comparison and optimization are properties and not necessarily images per se (e.g., such as data acquired using a conventional 2D image acquisition device). However, they are models for geological objects, for instance channels, and are comparable using box counting techniques described herein. Further, process variables available in a modeling application to create such objects may be used to full capacity to attain a high degree of variability (e.g., generation of many test cases).

According to an embodiment, given a base case and a comparison case (e.g., a simulation case or other case for comparison), a box counting process can be applied to determine one or more parameter values that characterize the cases. In general, box counting may be implemented using a grid or using any of a variety of shapes; shapes need not form a grid or tessellate (e.g., align boundary-to-boundary) and shapes may overlap. As described, as dimension of a shape decreases and number of shapes applied to data increases, a double logarithmic plot of number of occupied shapes (e.g., occupied according to one or more criteria) versus the size of the shapes (e.g., a characteristic dimension of a shape) provides a downward slope that can be fit with a line (e.g., a regression line) to provide a fractal dimension $D_f$, which is a unique parameter describing the data (e.g., according to the one or more criteria used to define occupation of a shape).

According to an embodiment, a box counting process can add objectivity to a subjective process, which can expedite arrival at a best case match to an optimal case. In general, due to the ability of describing an object in its complexity and geometrical shape, a box counting process is not biased by human imprecision.

According to an embodiment, one or more computer-readable media may include computer-executable instructions to instruct a computing system to output information for controlling a process. For example, such instructions may provide for output to sensing process, an injection process, drilling process, an extraction process, etc.

Figure 11:
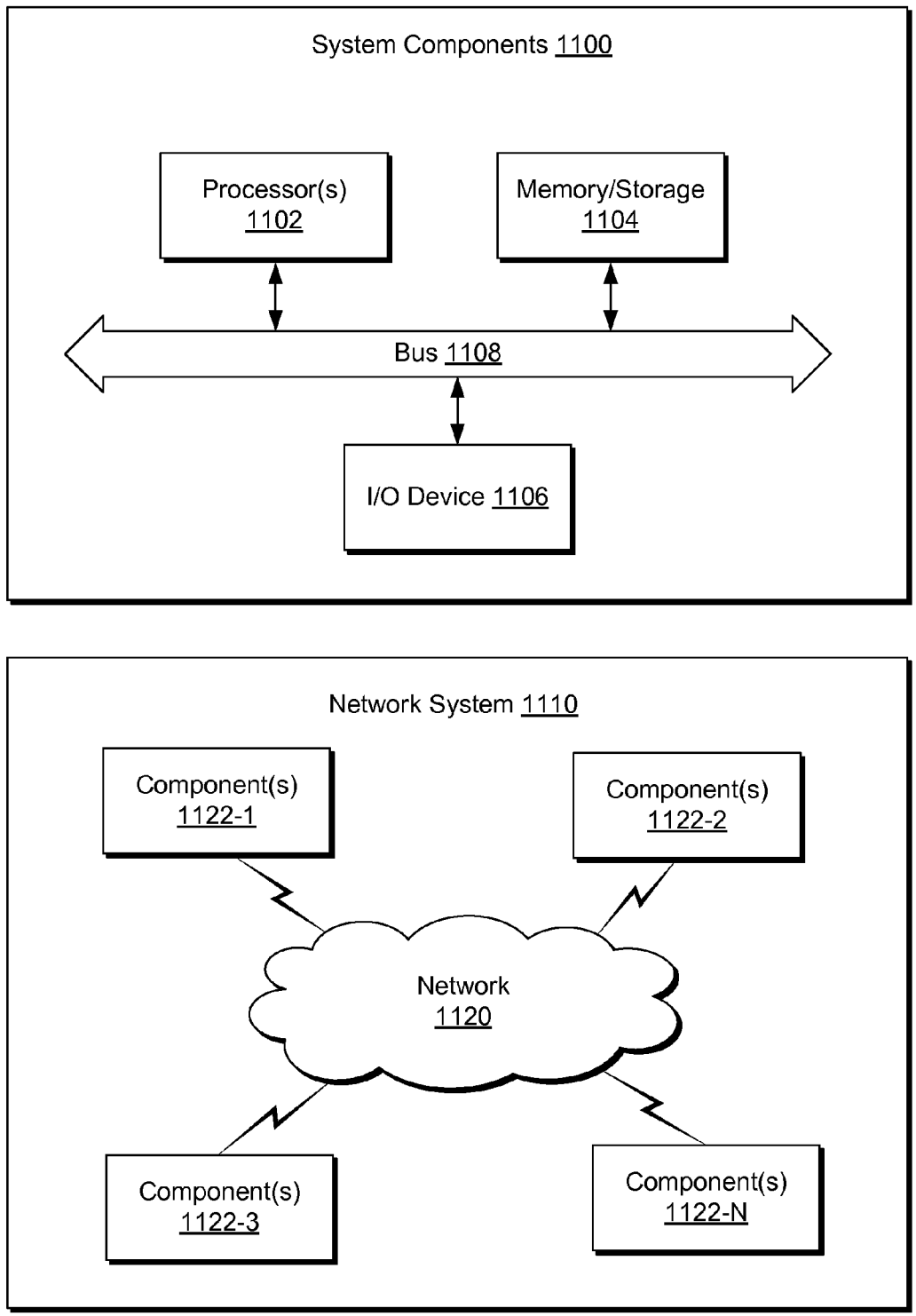
FIG. 11 illustrates example components of a system and a networked system.

FIG. 11 shows components of a computing system 1100 and a networked system 1110. The system 1100 includes one or more processors 1102, memory and/or storage components 1104, one or more input and/or output devices 1106 and a bus 1108. According to an embodiment, instructions may be stored in one or more computer-readable media (e.g., memory/storage components 1104). Such instructions may be read by one or more processors (e.g., the processor(s) 1102) via a communication bus (e.g., the bus 1108), which may be wired or wireless. The one or more processors may execute such instructions to implement (wholly or in part) one or more attributes (e.g., as part of a method). A user may view output from and interact with a process via an I/O device (e.g., the device 1106). According to an embodiment, a computer-readable medium may be a storage component such as a physical memory storage device, for example, a chip, a chip on a package, a memory card, etc.

According to an embodiment, components may be distributed, such as in the network system 1110. The network system 1110 includes components 1122-1, 1122-2, 1122-3, . . . 1022-N. For example, the components 1122-1 may include the processor(s) 1102 while the component(s) 1122-3 may include memory accessible by the processor(s) 1102. Further, the component(s) 1102-2 may include an I/O device for display and optionally interaction with a method. The network may be or include the Internet, an intranet, a cellular network, a satellite network, etc.

CONCLUSION

Although various methods, devices, systems, etc., have been described in language specific to structural features and/or methodological acts, it is to be understood that the subject matter defined in the appended claims is not necessarily limited to the specific features or acts described. Rather, the specific features and acts are disclosed as examples of forms of implementing the claimed methods, devices, systems, etc.

The invention claimed is:

1. A method comprising:
providing spatial data for a base case of a subsurface geologic formation;
providing spatial data for a simulation case of the subsurface geologic formation;
performing box counting for the spatial data for the base case;
performing box counting for the spatial data for the simulation case;
based on the box counting for the spatial data for the base case, determining a fractal dimension for the base case;
based on the box counting for the spatial data for the simulation case, determining, sing a processor, a fractal dimension for the simulation case;
comparing the simulation case to the base case based at least in part on the fractal dimensions; and
based on the comparing, adjusting one or more simulation parameters to generate spatial data for an additional simulation case of the subsurface geologic formation.

2. The method of claim 1 wherein the providing spatial data for the base case comprises providing seismic data for the subsurface geologic formation.

3. The method of claim 1 wherein the determining the fractal dimension for the base case and the determining the fractal dimension for the simulation case comprise determining a regression coefficient corresponding to a relationship between a characteristic of a box counting shape and a number of the shapes occupied by a spatial data feature.

4. The method of claim 1 wherein the spatial data for the base case and the spatial data for the simulation case comprise one-dimensional spatial data; or wherein the spatial data for at least the base case comprises multi-dimensional spatial data.

5. The method of claim 1 wherein a dimensionality of a box counting shape differs from a dimensionality of the spatial data of the base case.

6. The method of claim 1 wherein the performing box counting for the spatial data for the base case comprises using a larger range of box counting shape sizes than the performing box counting for the spatial data of the simulation case.

7. The method of claim 1 wherein the performing box counting for the spatial data for the base case comprises portioning the spatial data for the base case, and wherein the performing box counting for the spatial data for the simulation case comprises portioning the spatial data for the simulation case.

8. The method of claim 1 wherein the adjusting one or more simulation parameters to generate spatial data for an additional simulation case of the subsurface geologic formation comprises generating spatial data for the additional simulation case and performing box counting for the spatial data for the additional simulation case, determining a fractal dimension for the additional simulation case, and comparing the additional simulation case to the base case based at least in part on their fractal dimensions.

9. The method of claim 1 wherein the performing box counting for the spatial data for the base case comprises determining a number of box counting shapes occupied by a spatial data feature wherein the spatial data feature comprises a feature associated with a facies analysis.

10. The method of claim 1 wherein the performing box counting for the spatial data for the base case comprises directional box counting.

11. The method of claim 1 wherein the performing box counting for the spatial data for the base case comprises multi-directional box counting and wherein the determining a fractal dimension for the base case comprises determining a fractal dimension for each of direction of the multi-dimensional box counting.

12. The method of claim 1 wherein the comparing comprises rendering a graphical user interface that comprises a control graphic to access the one or more simulation parameters.

* * * * *